United States Patent
Valley et al.

Patent Number: 6,068,881
Date of Patent: May 30, 2000

[54] SPIN-APPLY TOOL HAVING EXHAUST RING

[75] Inventors: Robert T. Valley, South Burlington; Gary P. Viens, Colchester; James R. Weightman, Bristol, all of Vt.

[73] Assignee: International Business Machines Corporation, Armonk, N.Y.

[21] Appl. No.: 09/087,023

[22] Filed: May 29, 1998

[51] Int. Cl.[7] .................................................. B05D 3/12
[52] U.S. Cl. ........................ 427/240; 118/52; 427/385.5; 437/231
[58] Field of Search ............... 427/240, 385.5; 437/231; 118/52

[56] References Cited

U.S. PATENT DOCUMENTS

| | | |
|---|---|---|
| 2,033,469 | 3/1936 | Jones . |
| 4,510,176 | 4/1985 | Cuthbert ................................ 427/240 |
| 4,889,066 | 12/1989 | Kawakami ............................ 427/240 |
| 4,899,685 | 2/1990 | Kawakami ............................ 118/50 |
| 5,013,586 | 5/1991 | Cavazza ................................ 427/240 |
| 5,199,988 | 4/1993 | Kamezaki et al. .................... 118/52 |
| 5,238,713 | 8/1993 | Sago et al. ............................. 427/240 |
| 5,580,607 | 12/1996 | Takekuma et al. ................... 427/240 |
| 5,670,210 | 9/1997 | Mandal et al. ........................ 427/240 |
| 5,705,223 | 1/1998 | Bunkofse .............................. 427/240 |

FOREIGN PATENT DOCUMENTS

| | | |
|---|---|---|
| 4-118074 | 4/1992 | Japan . |
| 4-349873 | 12/1992 | Japan . |
| 6-170316 | 6/1994 | Japan . |

OTHER PUBLICATIONS

"SiO2 Sputtering Disposable Liner" by G.F. Cunningham, Jr. IBM Technical Disclosure Bulletin. vol. 14, No. 10, Mar., 1972.

"Disposable Blood Centrifuge Liner" by R.M. Kellogg & J.H. Williams. IBM Technical Disclosure Bulletin. vol. 18, No. 5, Oct., 1975.

*Primary Examiner*—Janyce Bell
*Attorney, Agent, or Firm*—Ratner & Prestia; James M. Leas

[57] ABSTRACT

A spin-apply tool avoids contamination of a substrate back surface by providing exhaust along or beyond a periphery of a splash shield. The peripheral exhaust pulls a mist of droplets of liquid spun off the substrate away from the substrate. The spin-apply tool includes a spin chuck for holding the substrate, a basin extending around the chuck, a splash shield in the basin, and an exhaust substantially symmetric with the center of the substrate. The chuck surface defines a plane, and the splash shield extends as a ring around the chuck at an angle to that plane sufficient to deflect liquid flying off the chuck down to the basin. The basin may have a removable liner that can be cleaned and reused. Use of solvent to clean the backside of substrates is avoided. And a basin drain is eliminated, eliminating the need for any solvent consumption.

18 Claims, 4 Drawing Sheets

SPIN-APPLY TOOL HAVING EXHAUST RING

TECHNICAL FIELD

The present invention relates generally to substrate coating equipment and, more particularly, to a spin-apply tool for applying a liquid as a coating on a substrate.

BACKGROUND OF THE INVENTION

In the manufacture of electronic circuits on semiconductor wafers or substrates, many processes use a coating of photoresist on the substrate to define the circuit to be etched or deposited on the substrate surface. The process of depositing the photoresist coating is often done on a spin-apply tool wherein the substrate is spun on a spin chuck while photoresist is applied.

Spinning the substrate while the photoresist is applied results in atomized liquid flying off the substrate and the chuck. Thus, the spinning process is usually done inside some sort of enclosure having a basin to catch the liquid. The atomized liquid may form a cloud above the substrate and re-deposit in an uneven pattern on the substrate, if the cloud is not evacuated from the enclosure. Typically, therefore, the enclosure is operated under negative pressure, and an exhaust is provided at the bottom of the basin for both the liquid and vapor discharges.

Sometimes, the liquid flying off the chuck may find its way to the underside of the substrate. This requires rinsing the underside of the substrate after the spin operation has been completed, taking extra time in the manufacturing process.

The deficiencies of the conventional spin-apply tools show that a need still exists for improvement. To overcome the shortcomings of the conventional devices, a new tool is needed and this tool is provided by the following invention.

SUMMARY OF THE INVENTION

An object of the present invention is to avoid contamination of the back surface of the substrate.

Another object of the present invention is to avoid use of solvent to clean the back surface of the substrate.

Another object of the present invention is to avoid use of solvent to maintain flow of spun off liquid through a drain at the bottom of the basin.

A feature of the present invention is that exhaust is provided in a location that avoids turbulent flow that might bring liquid particles in contact with the back surface of the substrate.

Another feature of the present invention is that an exhaust ring is located along or beyond an outer periphery of the splash shield basin, providing exhaust from above and below the splash shield.

An advantage of the present invention is that substrates have front surfaces coated with liquid while back surfaces are clean without the need for a cleaning step.

To achieve this and other objects, and in view of its purposes, the present invention provides a spin-apply tool for applying a liquid as a coating on a substrate, the tool comprising a spin chuck for holding the substrate. The chuck has a surface defining a plane. A basin extends around the chuck. A splash shield is in the basin, and extends as a ring around the chuck. The shield is at an angle to the plane sufficient to deflect liquid flying off the substrate to the basin. The splash shield has an outer periphery. An exhaust system provides exhaust along or beyond the outer periphery. The basin may have a removable liner that can be cleaned and reused.

It is to be understood that both the foregoing summary and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

The present inventors discovered that prior art spin apply tools having exhaust and drain together at the bottom of the basin contributes to the stream of liquid being pulled toward the underside of the substrate. They found that particles of the spun off liquid are drawn past the edge of the substrate toward the exhaust located at the bottom of the basin and turbulent airflow around the wafer edge causes liquid droplets to contaminate the underside surface of the substrate.

The inventors designed and built apparatus, now in production, for spin applying polyimide that avoids deposition of polyimide on the back surface of a semiconductor wafer substrate. The apparatus includes a deflector plate and a ring shaped exhaust system for deflecting liquid particles away from the wafer. The exhaust system, provided as a ring adjacent the sidewall of the basin, pulls air both above and below the deflector plate. Atomized liquid droplets that spin off the wafer are pulled outward and away from the wafer; in particular away from the back surface of the wafer. Droplets are not pulled downward along the edge of the wafer and turbulent flow contamination of the back surface is therefore avoided.

The invention will next be illustrated with reference to the figures wherein similar numbers indicate the same elements in all figures. Such figures are intended to be illustrative rather than limiting and are included herewith to facilitate the explanation of the apparatus of the present invention.

Figure 1:
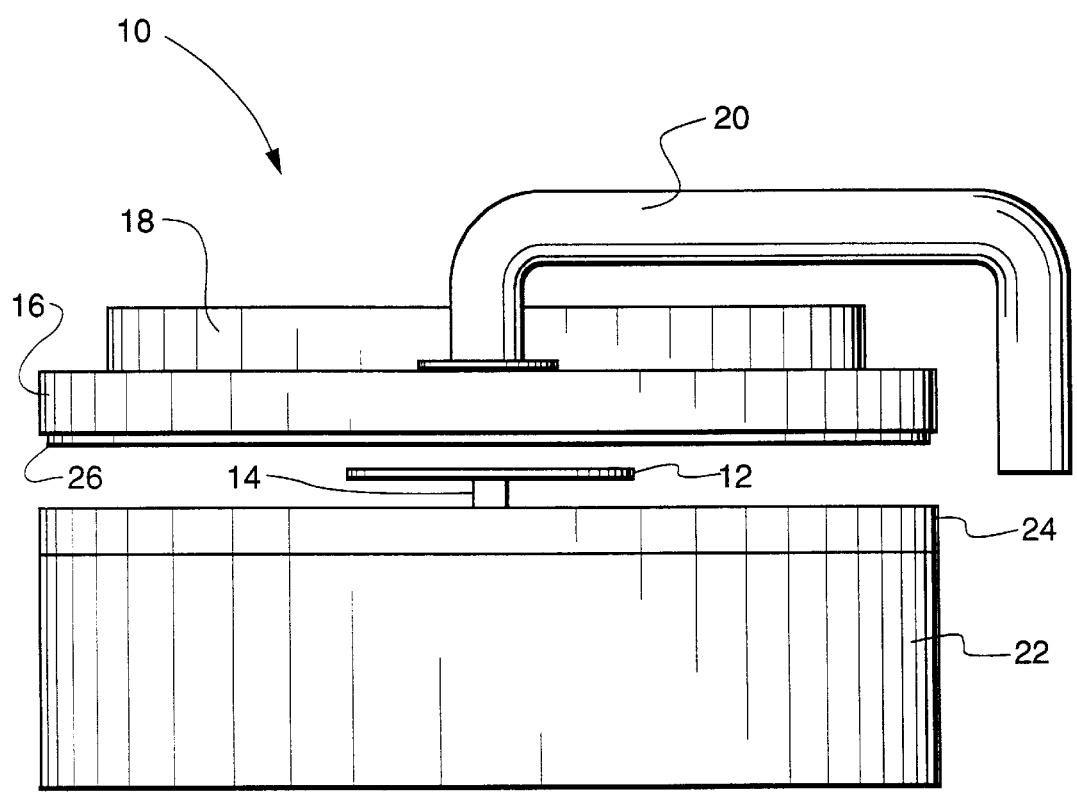
FIG. 1 is a side view of the spin-apply tool of the present invention in the open position.

Referring now to FIG. 1, there is shown an external view of the spin-apply tool 10 of the present invention in an open position. Spin chuck 12 rotates on shaft 14, but is fixed horizontally and vertically. Exhaust ring 16, on top of which cover 18 is mounted, is also fixed horizontally and vertically in a position above chuck 12. Exhaust ring 16 has two exhaust ports 20, one on either side of cover 18. Exhaust ports 20 are connected to mounts (not shown) that hold exhaust ports 20 in place, thus fixing the location of exhaust ring 16 and cover 18 in relation to chuck 12.

Basin 22 surrounds chuck 12 and shaft 14, and splash shield 24 in the form of a ring surrounding chuck 12 is mounted on top of basin 22. Basin 22 is mounted on a movable baseplate (not shown). To close spin-apply tool 10, basin 22 is moved upward (by structure not shown) until the top of splash shield 24 seals with exhaust ring 16 along exhaust ring lip 26. Movement of basin 22 may be activated by hydraulic or pneumatic lifting devices, or by mechanical linkages. The movement may be automatic or manual.

Figure 2:
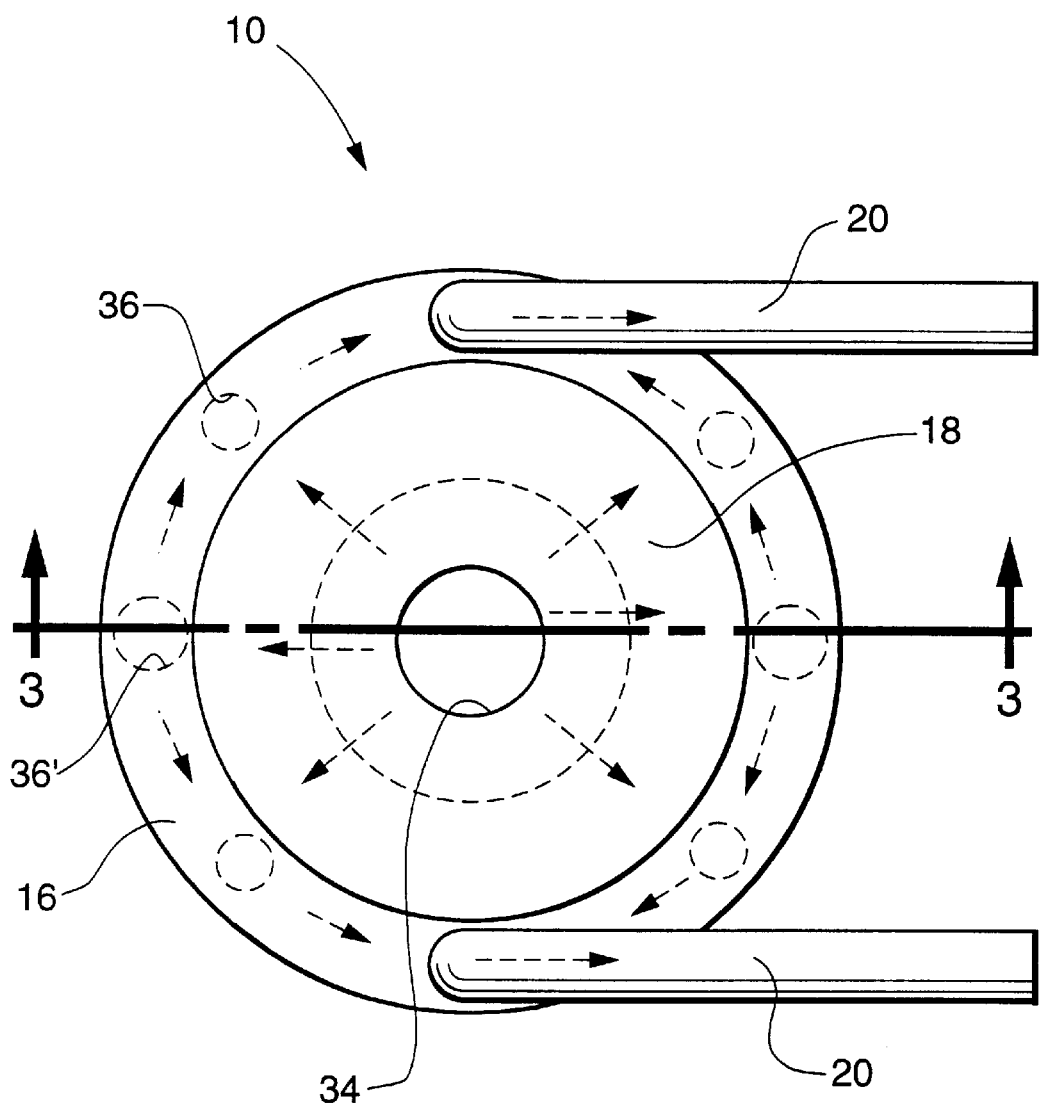
FIG. 2 is a top view of the spin-apply tool lid of the present invention.
Figure 3:
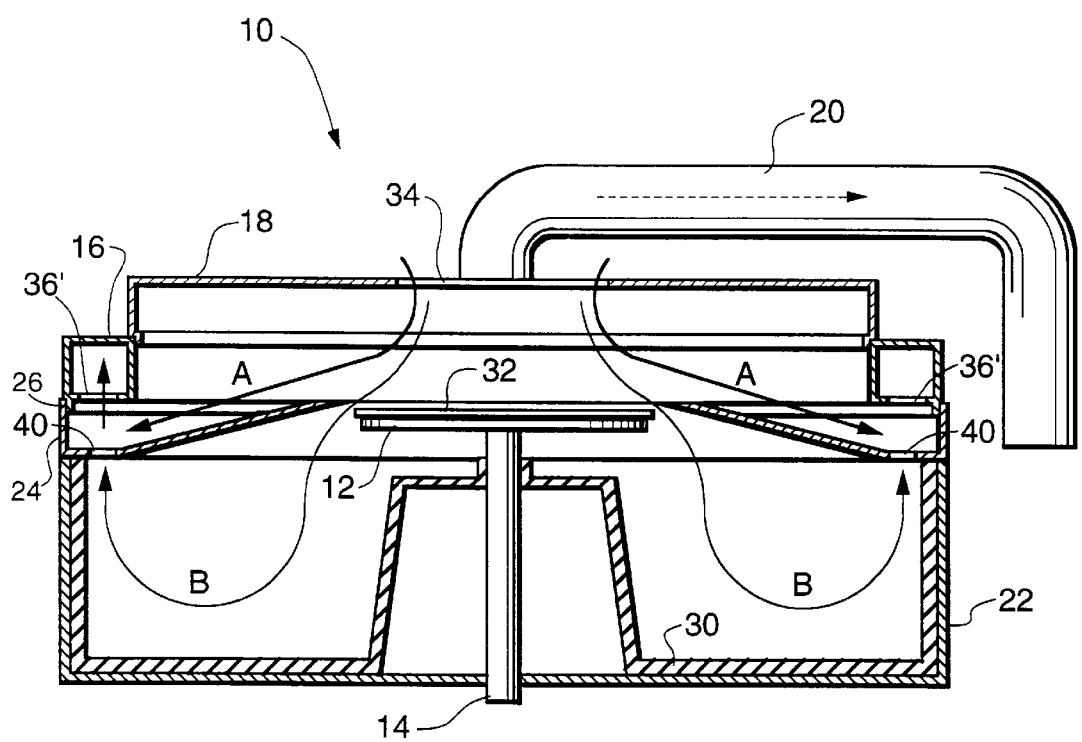
FIG. 3 is a cross-sectional view, taken along the line labeled "3" in FIG. 2, of the spin-apply tool of the present invention in the closed position.
Figure 3A:
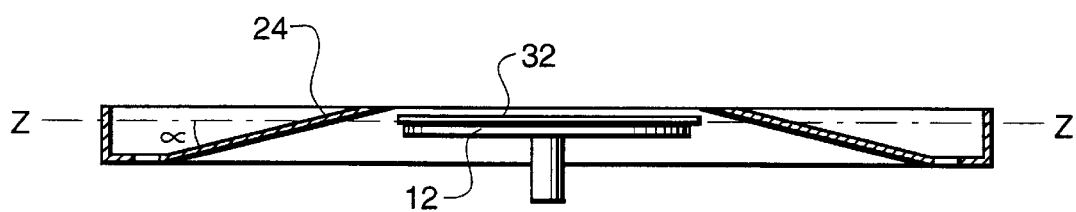
FIG. 3A is an isolated, cross-sectional view of the splash shield and the chuck, showing the angle between the planar surface of the chuck and the splash shield.

Referring now to FIGS. 2, 3, and 3A, there are shown, respectively, a top view of spin-apply tool 10, a cross-section of spin-apply tool 10 in a closed position, and a cross-section of splash shield 24 and chuck 12. As shown in FIG. 3, basin 22 may have a basin liner 30. Basin liner 30 may be removable so that it may be cleaned and reused.

With spin-apply tool 10 in the closed position, splash shield 24 extends above substrate (or wafer) 32 mounted on spin chuck 12, and spin-apply tool 10 is sealed except for an air entry hole 34 in the top of cover 18, through which air may enter. The spin-apply tool enclosure is kept under negative pressure by pulling a vacuum through exhaust ports 20. Thus, air enters through air entry hole 34 and sweeps any vapor, atomized liquid, and foreign material particles out through exhaust ring 16, as shown by the arrows in FIGS. 2 and 3.

As shown in FIG. 2, exhaust ring 16 has a number of exhaust ring openings 36 and 36' through which air, vapor, and particles are evacuated from the enclosure. Openings 36' farther away from exhaust ports 20 may be larger than openings 36 closer to exhaust ports 20, so that the air flow is uniform through each opening 36, 36'. Although the embodiment in FIG. 2 is shown having six openings 36, 36', any number of openings having any size may be sufficient.

As shown in FIG. 3A, splash shield 24 is angled with respect to plane Z at an angle α. Angle α is preferably about 30 degrees or less. The angle allows splash shield 24 to direct the liquid down into basin 22.

To operate spin-apply tool 10 of the present invention, basin 22 is lowered and substrate 32 is placed on chuck 12 along plane Z as shown in FIG. 3A. Basin 22 is then raised until splash shield 24 mates with exhaust ring 16 to close spin-apply tool 10. Shaft 14 is then rotated by a motor (not shown). Photoresist, a photosensitive polyimide, or some other liquid is applied to substrate 32 through entry hole 34 in cover 18. Cover 18 may be made of quartz or some other clear material to allow visibility of the operation inside.

When the liquid hits spinning substrate 32, it flies outward away from the center of substrate 32 and impinges on splash shield 24. The air, vaporized liquid, atomized liquid, and foreign material particles follow the arrows shown in FIGS. 2 and 3 through the enclosure into exhaust ring 16 through openings 36 and 36', and leave exhaust ring 16 through exhaust ports 20.

As shown in FIG. 3, the majority of the air entering the enclosure follows arrows "A" across the top of splash shield 24 and through openings 36 and 36' into exhaust ring 16. Any air that gets under splash ring 24 and into basin 30 can follow arrows "B" out through splash shield holes 40, through openings 36 and 36', and into exhaust ring 16. Following use of spin-apply tool 10, basin liner 30 may be removed from basin 22 for cleaning and reuse.

Figure 4:
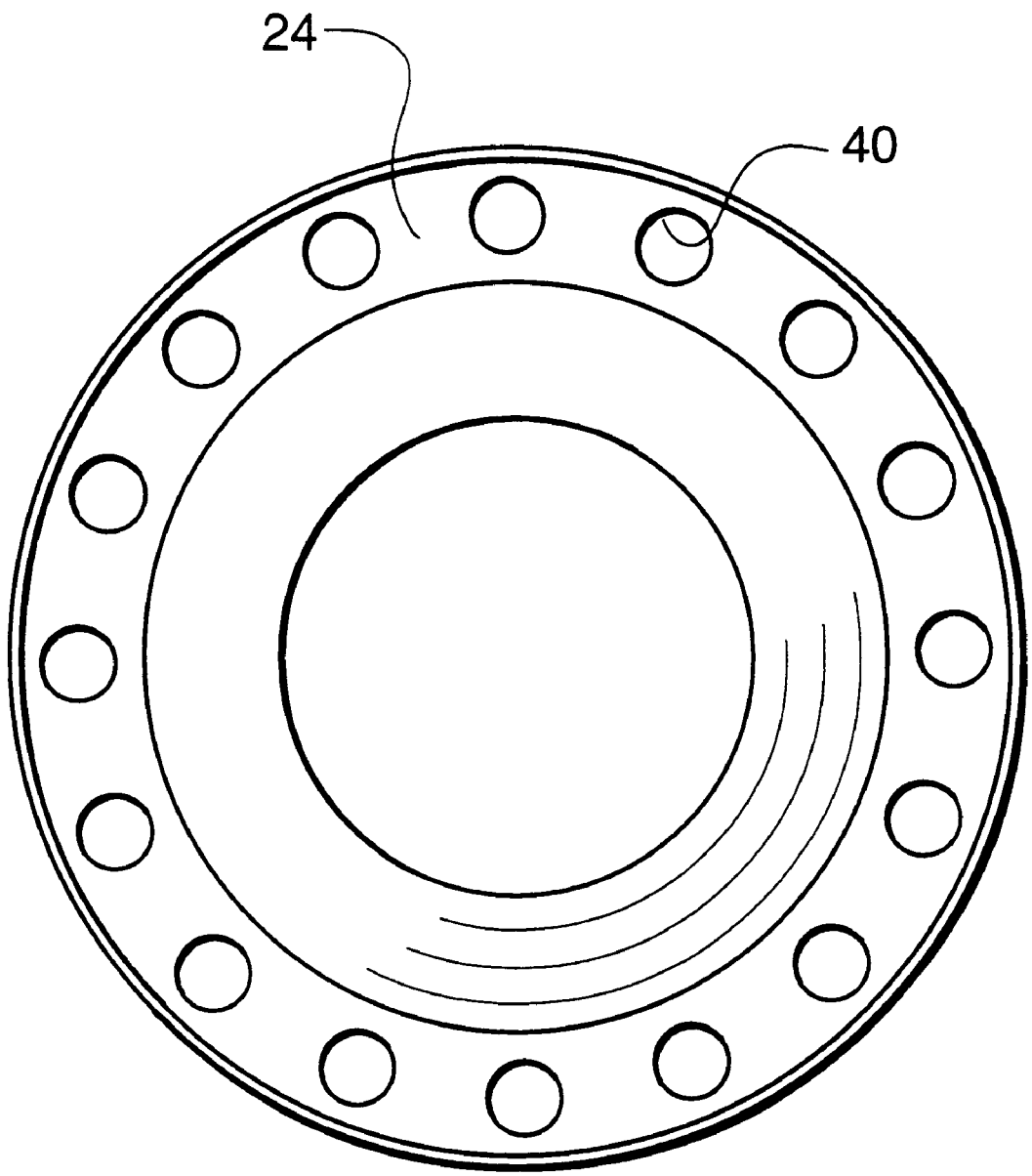
FIG. 4 is a top view of the splash shield.

Referring now to FIG. 4, there is shown a top view of splash shield 24. Splash shield 24 has a number of splash shield holes 40 that allow air to flow out of basin 30 into exhaust ring 16 as previously described. Holes 40 may be aligned with openings 36' as shown in FIG. 3, and other holes 40 may be aligned with openings 36, but this alignment is not required. There may be more holes 40 than openings 36 and 36', or there may be the same number of both, each hole 40 aligned with an opening 36 or 36'.

The inventors found that a Convac Model 8000 apply and bake track tool could be modified to provide the present invention. The drain formerly located at the bottom of the basin was eliminated. Exhaust was moved from the bottom of the basin to a location as described herein above and illustrated in FIG. 3. A PFA liner was used in the basin to catch spun off liquid and to facilitate cleaning. In addition, for the photosensitive polyimide used, opaque PFA tubing was substituted for the transparent tubing to avoid unwanted exposure of the photosensitive polyimide.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. For example a large number of holes or a groove may be provided for the exhaust to further reduce turbulent airflow around the back surface of the substrate that could bring atomized droplets in contact with the back surface.

What is claimed:

1. A spin-apply tool for applying a liquid as a coating on a substrate, the substrate having a periphery, the tool comprising:

a spin chuck adapted to hold the substrate, the chuck having a surface defining a plane;

a basin extending around said chuck;

a splash shield extending around said chuck; and an exhaust system providing exhaust beyond the substrate periphery and above said splash shield to pull particles away from the substrate.

2. The tool according to claim 1, wherein said basin has no drain.

3. The tool according to claim 1, wherein said splash shield extends above the plane defined by said chuck surface.

4. The tool according to claim 1, wherein said shield is at an angle to said plane, said angle sufficient to deflect liquid flying off the substrate to said basin.

5. The tool according to claim 4, wherein said angle is less than 30 degrees.

6. The tool according to claim 1, wherein the exhaust system provides exhaust above and below said splash shield.

7. The tool according to claim 1, wherein said basin has a removable liner.

8. The tool according to claim 7, wherein said liner is cleanable and reusable.

9. The tool according to claim 1, further comprising the liquid to be applied to the substrate as a coating, wherein the liquid comprises photosensitive liquid.

10. The tool according to claim 9, wherein the liquid comprises a photosensitive polyimide.

11. The tool according to claim 1, wherein the exhaust system provides exhaust ringing said periphery.

12. The tool according to claim 11, wherein the exhaust system provides exhaust substantially symmetric with said periphery.

13. The tool according to claim 11, wherein the exhaust system provides a preferential exhaust flow approximately in or above a plane defined by a top surface of the substrate so as to avoid pulling particles down past an edge of the substrate.

14. A spin-apply tool for applying a liquid as a coating on a substrate, the substrate having a front surface and a back surface, the tool comprising:

a spin chuck adapted to hold the substrate;

a basin extending around said chuck;

a splash shield extending around said chuck; and an exhaust system located to provide a preferential exhaust flow above said splash shield to avoid droplets from contaminating the substrate back surface.

15. A method of spin-applying a liquid as a coating on a substrate, the method comprising the steps of;

providing a spin chuck adapted to hold the substrate, the chuck having a surface defining a plane;

providing a basin extending around said chuck;

providing a splash shield extending around said chuck; and providing exhaust along or beyond an outer periphery of the substrate; spinning the substrate on the spin chuck; and applying the liquid as a coating on the substrate while the substrate is spinning on the spin chuck.

16. A method of spin-applying a liquid as a coating on a spinning substrate having a periphery, a top surface, and a back surface, the method comprising the steps of applying the liquid on the top surface of the spinning substrate and providing a splash shield extending as a ring around the substrate periphery, and an exhaust located to provide a preferential exhaust flow above the splash shield to minimize contamination of the substrate back surface such that the method does not require a rinsing step to remove spun-on liquid contamination from the substrate back surface.

17. A spin-apply tool for applying a liquid as a coating on a substrate, the substrate having a periphery, the tool comprising:

a spin chuck adapted to hold the substrate, the chuck having a surface defining a plane;

a basin extending around said chuck and having a removable liner; and an exhaust system providing exhaust beyond the substrate periphery to pull particles away from the substrate.

18. The tool according to claim 17, wherein said removable liner is cleanable and reusable.

\* \* \* \* \*